(12) United States Patent　　(10) Patent No.:　　US 6,310,496 B1
Nomura　　(45) Date of Patent:　　Oct. 30, 2001

(54) SIGNAL TRANSITION ACCELERATING DRIVER CIRCUIT FOR PROMPTLY DRIVING BUS LINE AND BUS DRIVING SYSTEM USING THE SAME

(75) Inventor: Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/243,549

(22) Filed: Feb. 3, 1999

(30) Foreign Application Priority Data

Feb. 6, 1998 (JP) .................................................. 10-041429

(51) Int. Cl.[7] ...................................................... H03B 1/00
(52) U.S. Cl. ............................ 327/112; 327/374; 326/27; 326/87; 307/412
(58) Field of Search ............................ 327/108–112, 374, 327/376, 377, 387; 330/253, 255; 326/26, 27, 28, 82–87, 89–91; 365/189.05, 189.08; 307/412

(56) References Cited

U.S. PATENT DOCUMENTS 5,500,817 * 3/1996 McLaury .................... 365/189.05
5,686,853　11/1997　Iima et al. ........................ 327/374
5,850,159 * 12/1998　Chow et al. ...................... 327/394

FOREIGN PATENT DOCUMENTS 8-186482　7/1996　(JP) .
9-50693　2/1997　(JP) .

OTHER PUBLICATIONS

Iima, T., et al., "Capacitance Coupling Immune, Transient Sensitive Accelerator for Resistive Interconnection Signals of Sub–quarter Micron ULSI," Symposium on VLSI Circuits Digest of Technical Papers, pp. 31–32.

* cited by examiner

Primary Examiner—Timothy P. Callahan
Assistant Examiner—Minh Nguyen
(74) Attorney, Agent, or Firm—Foley & Lardner

(57) ABSTRACT

A signal transition accelerating driver circuit for driving a signal line in the presence of an enable signal of a high level and to a potential level on the signal line for accelerating the potential change on the signal line in the presence of the enable signal of the low level, the signal transition accelerating driver circuit has a timer for determining an end point of the acceleration, thereby accurately defining a time period for accelerating the potential change.

14 Claims, 8 Drawing Sheets

US 6,310,496 B1

SIGNAL TRANSITION ACCELERATING DRIVER CIRCUIT FOR PROMPTLY DRIVING BUS LINE AND BUS DRIVING SYSTEM USING THE SAME

FIELD OF THE INVENTION

This invention relates to a bus driver and, more particularly, to a signal transition accelerating driving circuit and a bus driving system implemented by the signal transition accelerating driving circuits.

DESCRIPTION OF THE RELATED ART

The signal transition accelerating bus driver aims at elimination of a time lug from a signal propagation along a signal line with a large time constant. Typical examples of the signal transition accelerator are disclosed in Japanese Patent Publication of Unexamined Application No. 8-186482 and in "Capacitance Coupling Immune, Transient Sensitive Accelerator for Resistive Interconnection Signals of Sub-quarter Micron VLSI", 1995 Symposium on VLSI Circuits Digest of Technical Papers. The prior art signal transition accelerators detect a signal transition propagated along a bus line, and accelerate the signal transition for eliminating a time lug due to the gentle transition.

Another prior art bus driver system is disclosed in Japanese Patent Publication of Unexamined Application No. 9-50693, and is incorporated in a memory device. The prior art bus driver system uses a non-selected bus driver in order to assist a signal transition on a bus line, thereby accelerating a signal propagation to the output end of the bus line without increase in the current driving capability of the plural bus drivers.

FIG. 1 illustrates a typical example of the signal transition accelerating bus driver. The prior art signal transition accelerating bus driver is broken down into an output driver 1, a gate circuit 2 and a signal transition accelerator 3. A p-channel enhancement type field effect transistor Qp1 and an n-channel enhancement type field effect transistor Qn1 are connected in series between a high level line 4 and a low level line 5, and the series combination of the p-channel enhancement type field effect transistor Qp1 and the n-channel enhancement type field effect transistor Qn1 serves as the output driver 1. The p-channel enhancement type field effect transistor Qp1 and the n-channel enhancement type field effect transistor Qn1 complementarily turn on and off, and supply the high level or the low level to a bus line 6.

The gate circuit 2 includes two transfer gates 7/8 and an inverter 9. The transfer gates 7 and 8 are connected between a data line 10 and the gate electrodes of the field effect transistors Qp1/Qn1. An enable signal line 11 is connected to the inverter 9 and the first control nodes of the transfer gates 7/8, and the inverter 9 is connected to the second control nodes of the transfer gates 7/8. The enable signal line 11 propagates the enable signal EBL1 to the first control nodes of the transfer gates 7/8, and the inverter 9 supplies the inverted signal CEBL1 of the enable signal EBL1 to the second control nodes of the transfer gates 7/8. When the enable signal EBL1 is in the high level, the transfer gates 7/8 turn on, and a data signal Sin is transferred through the transfer gates 7/8 to the gate electrodes of the field effect transistors Qp1/Qn1.

The signal transition accelerator 3 includes a NAND gate 12, a NOR gate 13, delay circuits 14/15 and transfer gates 16/17. The NAND gate 12 has two input nodes one of which is directly connected to the bus line 6 and the other of which is connected through the delay circuit 14 to the bus line 6. Similarly, the NOR gate 13 has two input nodes one of which is directly connected to the bus line 6 and the other of which is connected through the delay circuit 15 to the bus line 6. The output node of the NAND gate 12 is connected through the transfer gate 16 to the gate electrode of the p-channel enhancement type field effect transistor Qp1, and the output node of the NOR gate 13 is connected through the transfer gate 17 to the gate electrode of the n-channel enhancement type field effect transistor Qn1. Each of the delay circuits 14/15 is implemented by an odd number of inverters connected in series, and both delay circuits 14/15 introduce a predetermined delay time into the propagation of a potential level on the bus line 6. The potential level on the bus line 6 is propagated to the other end of the bus line 6 as a data signal Sout, and returns to the signal transition accelerator as a bus status signal BS1. The delay circuits 14/15 supply an inverted signal CBS1 to the other input node of the NAND gate 12 and the other input node of the NOR gate 13. The NAND gate 12 and the NOR gate 13 offer a feedback loop to the gate electrode of the p-channel enhancement type field effect transistor Qp1 or the gate electrode of the n-channel enhancement type field effect transistor Qn1 depending upon the bus status signal BS1. The inverter 9 supplies the inverted signal CEBL1 to the first control nodes of the transfer gates 16/17, and the enable signal line 11 supplies the enable signal EBL1 to the second control nodes of the transfer gates 16/17. When the enable signal EBL1 is in the low level, the transfer gates 16/17 turn on, and the NAND gate 12 and the NOR gate 13 are connected through the transfer gate 16 to the gate electrode of the p-channel enhancement type field effect transistor Qp1 and through the transfer gate 17 to the gate electrode of the n-channel enhancement type field effect transistor Qn1.

The prior art signal transition accelerating bus driver drives the bus line 6 in response to the data signal Sin or the potential level on the bus line 6. Description is firstly made on the driving operation on the bus line 6 in response to the data signal Sin. The data signal Sin and the data signal Sout are assumed to be in the high level and in the low level, respectively. Accordingly, the bus status signal BS1 and the inverted signal CBS1 are in the low level and in the high level, respectively.

The enable signal EBL1 is firstly changed to the high level. The enable signal EBL1 causes the transfer gates 7/8 and the transfer gates 16/17 to turn on and off, respectively. The data signal Sin is changed from the high level to the low level, and the potential change is transferred to the gate electrode of the p-channel enhancement type field effect transistor Qp1 and the gate electrode of the n-channel enhancement type field effect transistor Qn1. The data signal Sin gives rise to decrease the potential level at the gate electrode of the p-channel enhancement type field effect transistor Qp1 and the gate electrode of the n-channel enhancement type field effect transistor Qn1. The p-channel enhancement type field effect transistor Qp1 is varied toward the on-state, and the n-channel enhancement type field effect transistor Qn1 is varied toward the off-state. The p-channel enhancement type field effect transistor Qp1 starts to flow electric current from the high level line 4 to the bus line 6. The electric current raises the potential level on the bus line 6, and the output signal Sout is changed from the low level to the high level.

On the other hand, if the enable signal EBL1 is changed to the low level, the prior art signal transition accelerating bus driver becomes responsive to the potential level on the bus line 6. The enable signal EBL1 causes the transfer gates 7/8 and the transfer gates 16/17 to turn off and on, respectively. As a result, the gate electrode of the p-channel enhancement type field effect transistor Qp1 and the gate electrode of the n-channel enhancement type field effect transistor Qn1 are electrically isolated from the data line 10.

The potential level on the bus line 6 is assumed to rise toward the high level. The delay circuits 14/15 keep the inverted signals CBS1 in the high level. When the potential level on the bus line 6 exceeds the threshold of the NAND/NOR gates 12/13, the bus status signal BS1 enables the NAND gate 12, and disables the NOR gate 13. The NOR gate 13 supplies the low level through the transfer gate 17 to the gate electrode of the n-channel enhancement type field effect transistor Qn1, and the n-channel enhancement type field effect transistor Qn1 turns off.

The bus status signal BS1 and the inverted signal CBS1 make both input nodes of the NAND gate 12 high. The NAND gate 12 changes the output node to the low level. The low level is transferred through the transfer gate 16 to the gate electrode of the p-channel enhancement type field effect transistor Qp1, and the p-channel enhancement type field effect transistor is changed to the completely on-state. As a result, the electric current flows through the p-channel enhancement type field effect transistor Qp1 to the bus line 6, and the output driver 1 changes the data signal Sout to the high level. Thus, the signal transition accelerator 3 offers the loop from the bus line 6 through the NAND gate 12 to the gate electrode of the p-channel enhancement type field effect transistor Qp1, and accelerates the potential rise on the bus line 6.

After the predetermined lapse of time, the inverted signal CBS1 is changed to the low level, and the NAND gate 12 changes the output node thereof to the high level. The p-channel enhancement type field effect transistor Qp1 is changed to the off-state. Thus, the loop is available for the rapid signal transition for the predetermined delay time of the delay circuit 14.

When the potential level on the bus line 6 is falling, from the high level to the low level, the NOR gate changes the output node thereof to the high level for the predetermined lapse of time, and the signal transition accelerator 3) offers the loop from the bus line 6 through the NOR gate 13 to the gate electrode of the n-channel enhancement type field effect transistor Qn1. The loop is also available for the rapid signal transition for the predetermined delay time of the delay circuit 15.

A problem is encountered in the prior art signal transition accelerating bus driver in the optimization of the accelerating time period. The inverters determine the delay time, and the switching speed of each inverter is sensitive to fluctuations in the fabrication process. In order to take up the variation of delay time, the manufacturer gives a margin to the delay circuits 14/15, and the long accelerating time period decelerates the signal transfer from the data line 10 to the bus line 6. Thus, the first problem inherent in the prior art is less prompt to the data signal Sin.

Another problem is wide area occupied by the inverters forming the delay circuits 14/15. When the manufacturer integrates the prior art signal transition accelerating bus driver together with other circuits, the semiconductor integrated circuit requires a large semiconductor chip, and the large semiconductor chip is causative of large production cost.

SUMMARY OF THE INVENTION

It is therefore an important object of the present invention to provide a signal transition accelerating driver circuit, which promptly drivers a signal line.

It is also an important object of the present invention to provide a signal transition accelerating driver circuit, which occupies narrow area on a semiconductor chip.

It is also an important object of the present invention to provide a driving system, which drives a signal line at high speed by means of the signal transition accelerating driver circuits.

In accordance with one aspect of the present invention, there is provided a signal driving circuit comprising an output driver connected between two sources of potential level different in potential level and a signal line to be driven and responsive to a first control signal for selectively connecting the two sources of potential level to the signal line, a controller responsive to a second control signal for changing an operation thereof between a first mode and a second mode and producing the first control signal on the basis of a data signal in the first mode for changing a potential level on the signal line and on the basis of the potential level on the signal line in the second mode for accelerating the change of the potential level, and a timer responsive to a pulse signal for determining an end point of the acceleration of the change.

In accordance with another aspect of the present invention, there is provided a driver system for changing a potential level on a signal line comprising at least one first driver circuit including a first output driver connected between two sources of potential level different in potential level and the signal line and responsive to a first control signal for selectively connecting the two sources of potential level to the signal line, a first controller responsive to a second control signal changed between a first level and a second level for changing an operation thereof between a first mode and a second mode and producing the first control signal on the basis of a first data signal in the first mode for changing a potential level on the signal line and on the basis of the potential level on the signal line in the second mode for accelerating the change of the potential level and a first timer responsive to a pulse signal for determining an end point of the acceleration of the change, at least one second driver circuit including a second output driver connected between the two sources of potential level and the signal line and responsive to a third control signal for selectively connecting the two sources of potential level to the signal line, a second controller responsive to a fourth control signal changed between the first level and the second level for changing an operation thereof between the first mode and the second mode and producing the third control signal on the basis of a second data signal in the first mode for changing the potential level on the signal line and on the basis of the potential level on the signal line in the second mode for accelerating the change of the potential level and a second timer responsive to the pulse signal for determining an end point of the acceleration of the change, and at least one third driver circuit including a third output driver connected between the two sources of potential level and the signal line and responsive to a fifth control signal for selectively connecting the two sources of potential level to the signal line, a third controller fixed to the second mode and producing the fifth control signal on the basis of the potential level on the signal line for accelerating the change of the potential level and a third timer responsive to the pulse signal for determining an end point of the acceleration of the change. At least one the first controller and the second controller is in the second mode.

BRIEF DESCRIPTION OF THE DRAWINGS

The features and advantages of the signal transition accelerating bus driver will be more clearly understood from the following description taken in conjunction with the accompanying drawings in which.

DESCRIPTION OF THE PREFERRED EMBODIMENTS

First Embodiment

Figure 1:
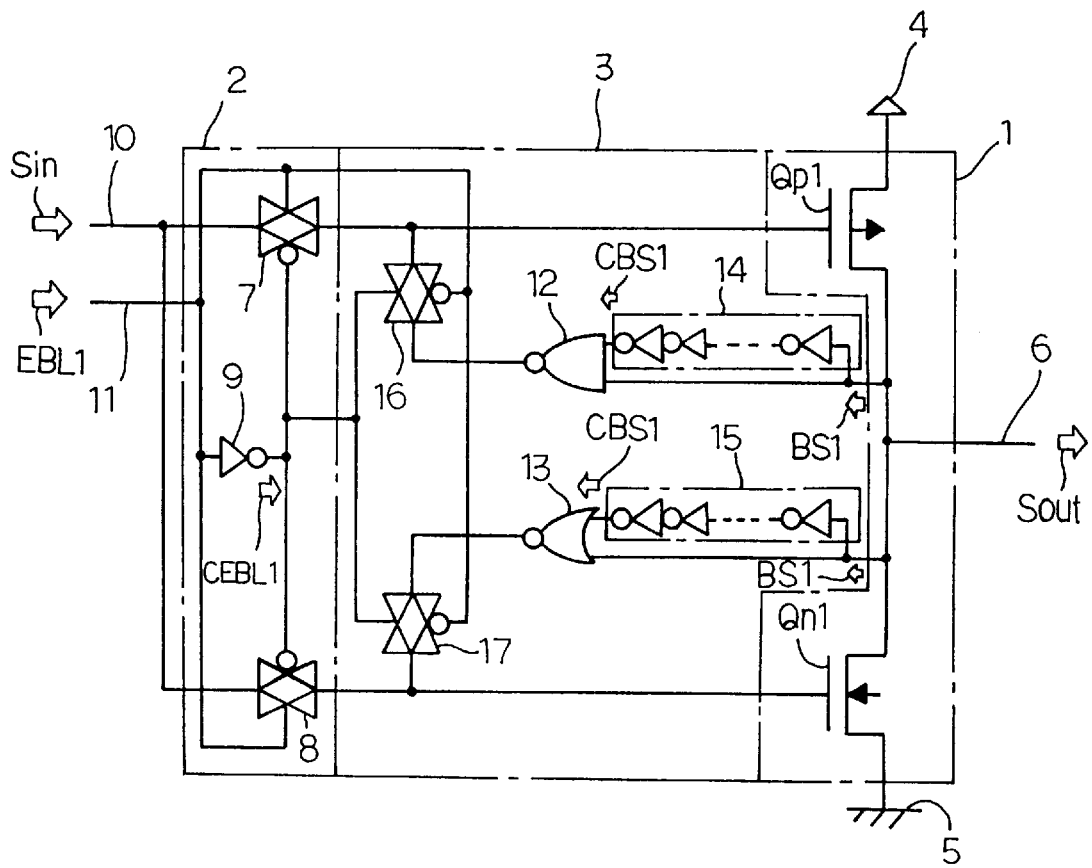
FIG. 1 is a circuit diagram showing the circuit configuration of the prior art signal transition accelerating bus driver.
Figure 2:
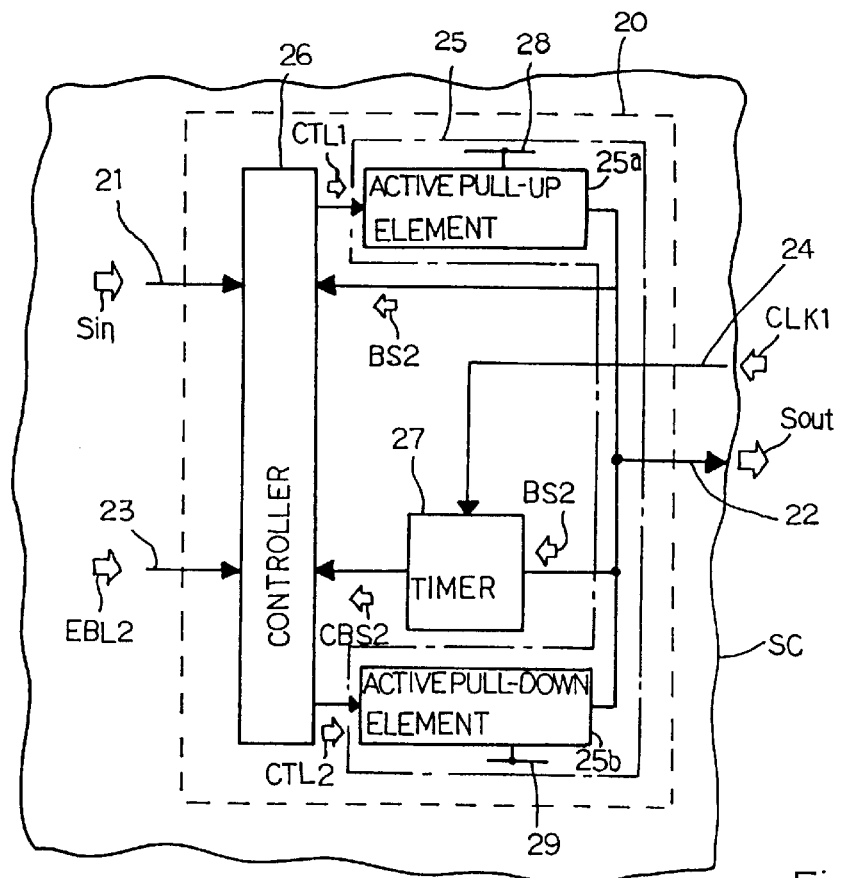
FIG. 2 is a block diagram showing the circuit configuration of a signal transition accelerating driver circuit according to the present invention.

Referring to FIG. 2 of the drawings, a signal transition accelerating driver circuit 20 embodying the present invention is inserted between a data line 21 and a bus line 22, and an enable signal EBL2 and a clock signal CLK1 are supplied through a control signal line 23 and a clock signal line 24 to the signal transition accelerating driver circuit 20. A data signal Sin is supplied to the controller 26 through the data line 21, and the output driver 25 changes the potential level on the bus line 22. The potential level on the bus line 22 serves as a bus status signal BS2 for the signal transition accelerating driver circuit 20 and a data signal Sout propagated along the bus line 22. The signal transition accelerating driver circuit 20 is integrated on a semiconductor chip SC together with the bus line 22 and other circuits.

The signal transition accelerating driver circuit 20 comprises an output driver 25, a controller 26 and a timer 27. The output driver 25 has an active pull-up circuit 25a and an active pull-down circuit 25b, and the bus line 22 is connectable through the active pull-up element 25a to a high level line 28 and through the active pull-down element 25b to a low level line 29.

The controller 26 is enabled with the enable signal EBL2 of high level, and the becomes responsive to the data signal Sin. While the enable signal EBL2 is making the controller 26 responsive to the data signal Sin, the controller 26 supplies control signals CTL1/CTL2 to the active pull-up element 25a and the active pull-down element 25b, and causes the output driver 25 to change the bus line 22 to the potential level of the data signal Sin. If the data signal Sin is in the high level, the active pull-up element 25a changes the bus line 22 to the high level. On the contrary, if the data signal Sin is in the low level, the active pull-down element 25b changes the bus line 22 to the low level.

While the enable signal is staying in the low level, the controller 26 does not respond to the data signal Sin. However, the controller 26 is responsive to the bus status signal BS2 and an inverted signal CBS2 of the bus status signal BS2 for a time period defined by the clock signal CLK1. The bus status signal BS2 gives a start timing for accelerating the signal transition on the bus line 22, and the inverted signal CBS2 gives an end point of the acceleration as described hereinbelow.

The clock signal CLK1 is supplied to the timer 27, and the timer 27 counts the clock pulses. When the clock pulses reaches a predetermined number, the timer 27 changes the inverted signal CBS2 to a potential level opposite to that of the bus status signal BS2. The clock signal CLK1 makes the timer 27 accurately define the time period for the acceleration of the signal transition. If the timer 27 is implemented by a delay flip flop, the acceleration is renewed at every pulse period in so far as the enable signal EBL2 is staying in the low level. If the timer 27 is implemented by a shift register, the acceleration is continued for a time period equal to a multiple of the pulse period.

Even if a fabrication process fluctuates, the clock frequency is never affected by the fluctuation, and the accelerating time period is free from it. The controller 26 is responsive to the bus status signal BS2 for rapidly changing the control signals CTL1/CTL2, and the control signals CTL1/CTL2 cause the output driver 25 to accelerate the signal transition on the bus line 22. When the timer 27 changes the inverted signal CBS2, the output driver 25 stops the acceleration of the signal transition on the bus line 22.

Figure 3:
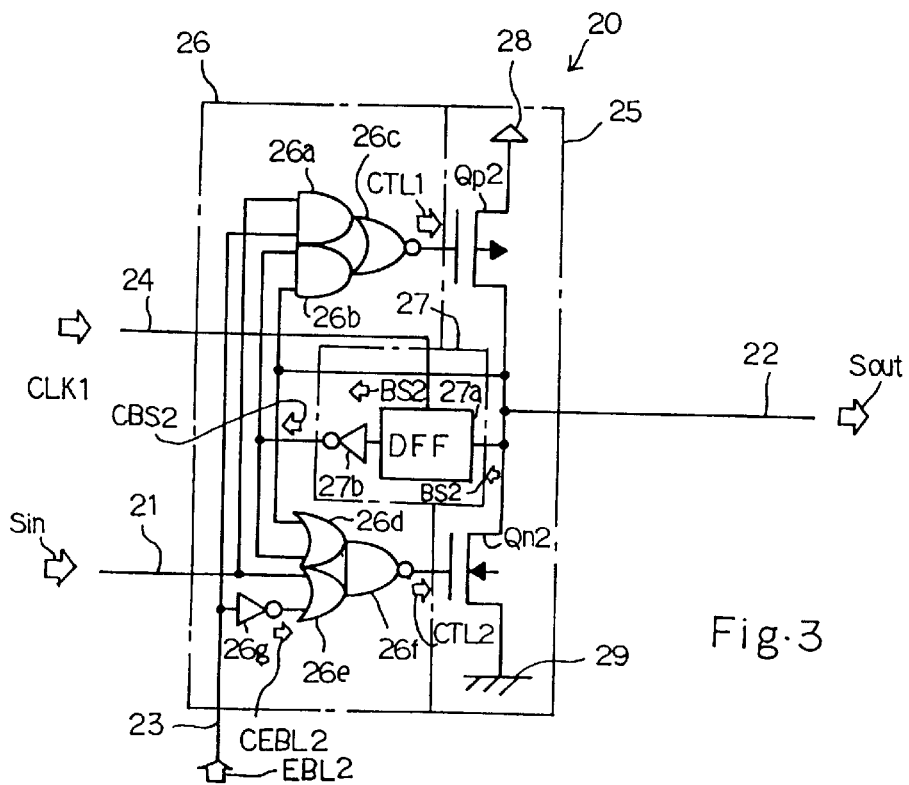
FIG. 3 is a circuit diagram showing, in detail, the circuit configuration of the signal transition accelerating driver circuit.

FIG. 3 illustrates the circuit configuration of the signal transition accelerating driver circuit 20 in detail. A p-channel enhancement type field effect transistor Qp2 and an n-channel enhancement type field effect transistor Qn2 are connected in series between the high voltage line 28 and the low voltage line 29, and form in combination the output driver 25.

The controller 26 includes two AND gates 26a/26b, a NOR gate 26c, two OR gate 26d/26e, a NAND gate 26f and an inverter 26g. The data signal Sin is supplied to the first input node of the AND gate 26a and the first input node of the OR gate 26e, and the enable signal EBL2 is supplied to the second input node of the AND gate 26a and the inverter 26g. The inverter 26g supplies an inverted signal CEBL2 of the enable signal EBL2 to the second input node of the OR gate 26e. While the enable signal EBL2 is staying in the low level, the AND gate 26a and the OR gate 26e respectively fix the output nodes thereof to the low level and the high level, and make the NOR gate 26c and the NAND gate 26f enabled. The NOR ate 26c and the NAND gate 26f are responsive to the bus status signal BS2 and the inverted signal CBS2 thereof for changing the control signals CTl1/CTL2.

The bus status signal BS2 is supplied to the first input node of the AND gate 26b and the first input node of the OR gate 26d, and the inverted signal CBS2 is supplied to the second input node of the AND gate 26b and the second input node of the OR gate 26d. While the enable signal is staying in the high level, the bus status signal BS2 is opposite in potential level to the inverted signal CBS2, and AND gate 26b and the OR gate 26d respectively fix the output nodes thereof to the low level and the high level, and make the NOR gate 26c and the NAND gate 26f enabled. For this reason, the NOR gate 26c and the NAND gate 26f are responsive to the data signal Sin.

The timer 27 includes a delay flip flop 27a and an inverter 27b. The delay flip flop 27a has an input node connected to the bus line 22 and a clock node supplied with the clock signal CLK1. The bus status signal BS2 is latched by the delay flip flop 27a in synchronism with a pulse rise of the clock signal CLK1. The output node of the delay flip flop 27a is connected to the input node of the inverter 27b. The delay flip flop 27a holds the potential level of the bus status signal BS2 during one pulse period, and the inverter 27b produces the inverted signal CBS2. Thus, the data holding time is equal to the pulse period of the clock signal CLK1, and is varied together with the frequency of the clock signal CLK1.

The signal transition accelerating driver circuit 20 shown in FIG. 3 behaves as follows. The data signal Sin is assumed to be changed from the low level to the high level. The bus line 22 is in the low level, and the bus status signal BS2 and the inverted signal CBS2 are in the low level and in the high level, respectively. The bus status signal BS2 of the low level and the inverted signal CBS2 of the high level cause the AND gate 26b and the OR gate 26d to yield the low level and the high level, and the NOR gate 26c and the NAND gate 26f are enabled with the output signal of the AND gate 26b and the output signal of the OR gate 26d, respectively.

The enable signal EBL2 is firstly changed from the low level to the high level. Then, the high level is given to the two input node of the AND gate 26a, and the AND gate yields the high level. The NOR gate 26c inverts the high level at the output node of the AND gate 26a to the low level, and changes the control signal CTL1 to the low level. The p-channel enhancement type field effect transistor Qp2 turns on, and supplies electric current to the bus line 22.

The data signal Sin of the high level causes the OR gate 26e to yield the high level, and the NAND gate 26f inverts the high level at the output node of the NOR gate 26e. The NAND gate 26f supplies the control signal CTL2 of the low level to the gate electrode of the n-channel enhancement type field effect transistor Qn2, and the n-channel enhancement type field effect transistor Qn2 turns off.

The electric current flows from the high level line 28 through the p-channel enhancement type field effect transistor Qp2 to the bus line 22, and gradually raises the potential level on the bus line 22.

While the bus line 22 is going up toward the high level, the enable signal EBL2 is changed from the high level to the low level. The AND gate 26a changes the output node thereof to the low level, and the inverted signal CEBL2 of the high level make the OR gate 26e maintain the output node thereof at the high level. For this reason, the NOR gate 26c is still enabled, and the OR gate 26d causes the NAND gate 26f to supply the control signal CTL2 of the low level to the gate electrode of the n-channel enhancement type field effect transistor Qn2.

When the bus status signal BS2 exceeds the threshold of the AND gate 26b, the high level is supplied to both input nodes of the AND gate 26b, and the shift register 27a starts to transfer the bus status signal BS2 of the high level from the first stage toward the final stage. The AND gate 26b changes the output node to the high level. The NOR gate 26c inverts the high level at the output node of the AND gate 26b, and supplies the control signal CTL1 of the low level to the gate electrode of the p-channel enhancement type field effect transistor Qp2. Then, the p-channel enhancement type field effect transistor Qp2 turns on, and the electric current flows through the p-channel enhancement type field effect transistor Qp2 to the bus line 22. Thus, the signal transition accelerating driver circuit accelerates the potential rise on the bus line 22 regardless of the potential level of the data signal Sin.

When the clock signal CLK1 rises to the high level, the delay flip flop 27a latches the high level of the bus status signal BS2, and the inverter 27b changes the inverted signal CBS2 to the low level. The AND gate 26b changes the output node to the low level. Then, the NOR gate 26c changes the control signal CTL1 to the high level, and the p-channel enhancement type field effect transistor Qp2 turns off. Thus, the signal transition accelerating driver circuit 20 continues the acceleration for the time period defined by the clock signal CLK1.

Subsequently, the data signal Sin is changed from the high level to the low level. The bus status signal BS2 of the high level and the inverted signal CBS2 thereof cause the AND gate 26b and the OR gate 26d to yield the low level and the high level, and the NOR gate 26c and the NAND gate 26 are enabled.

The enable signal EBL2 is changed from the low level to the high level. The data signal Sin of the low level causes the AND gate 26a to yield the low level, and the NOR gate 26c inverts the low level at the output node of the AND gate 26a. The control signal CTL1 of the high level is supplied to the gate electrode of the p-channel enhancement type field effect transistor Qp2, and the p-channel enhancement type field effect transistor Qp2 is turned off.

The low level is supplied to both input nodes of the OR gate 26e, and the NAND gate 26f inverts the low level at the output node of the OR gate 26e. The control signal CTL2 of the high level is supplied to the gate electrode of the n-channel enhancement type field effect transistor Qn2, and the n-channel enhancement type field effect transistor Qn2 starts to change the channel toward the on-state. The n-channel enhancement type field effect transistor Qn2 starts to discharge the electric current from the bus line 22, and gradually decays the potential level on the bus line 22 or the bus status signal BS2.

While the bus line 22 is going down toward the low level, the enable signal EBL2 is changed to the low level. The AND gates 26a/26b cause the NOR gate 26c to keep the control signal CTL1 at the high level, and the p-channel enhancement type field effect transistor Qp2 is turned off. The inverted signal CEBL2 of the high level allows the OR gate 26e to enable the NAND gate 26f with the high level at the output node thereof. When the bus status signal BS2 passes the threshold of the OR gate 26d, the shift register 27a starts to transfer the low level from the first stage toward the final stage, and the OR gate 26d changes the output node to the low level. The NAND gate 26f supplies the control signal CTL2 of the high level to the gate electrode of the n-channel enhancement type field effect transistor Qn2. The n-channel enhancement type field effect transistor Qn2 turns on, and accelerates the potential fall on the bus line 22. Thus, the signal transition accelerating driver circuit accelerates the signal transition on the bus line 22 regardless of the data signal Sin.

When the clock signal CLK2 rises to the high level, the delay flip flop 27a latches the low level of the bus status signal BS2, and the inverter 27b changes the inverted signal CBS2 to the high level. Then, the NAND gate 26f changes the control signal CTL2 to the low level, and the n-channel enhancement type field effect transistor Qn2 turns off. Thus, the signal transition accelerating driver circuit 20 continues the acceleration for the time period defined by the clock signal CLK1.

Figure 4:
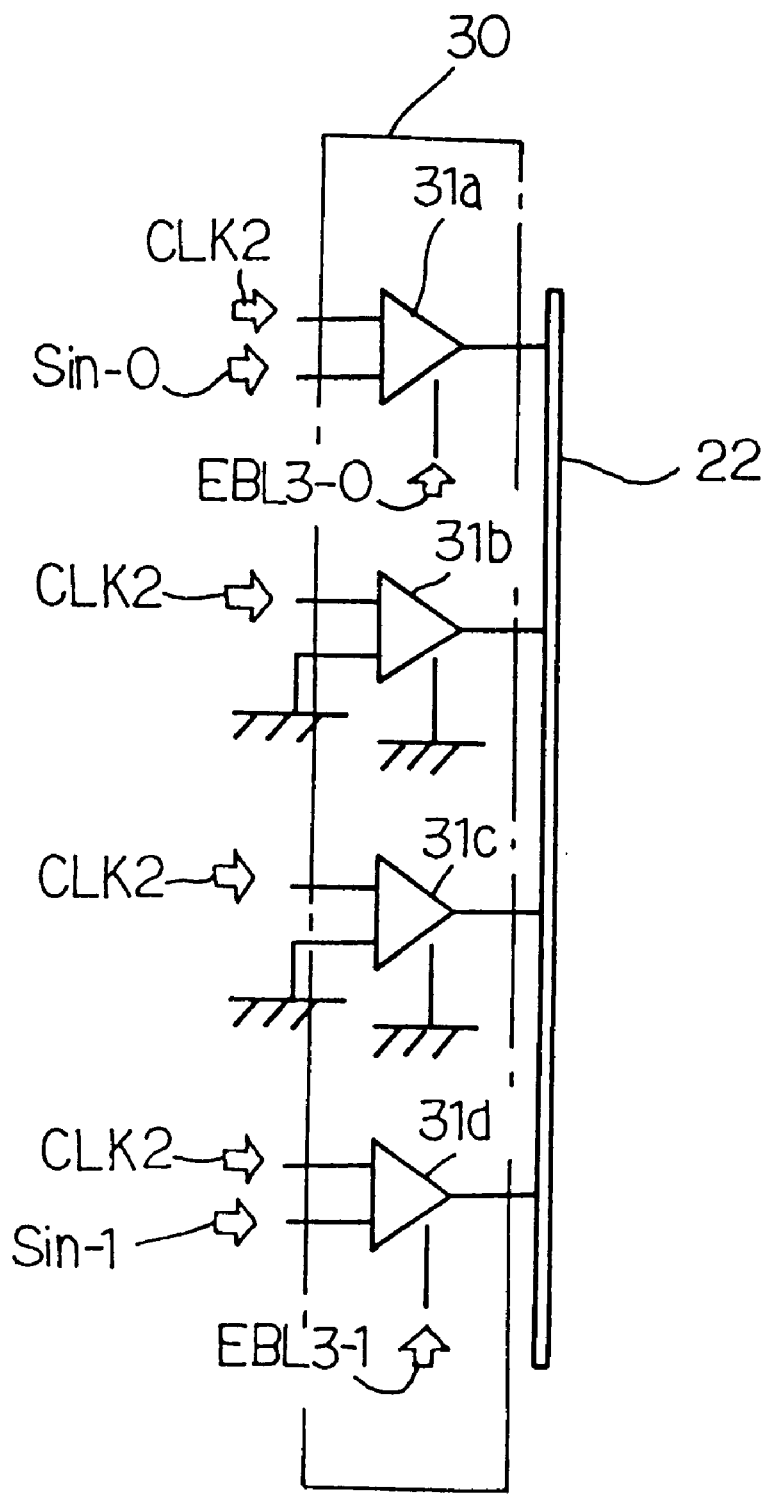
FIG. 4 is a circuit diagram showing a bus driving system according to the present invention.

Using the signal transition accelerating driver circuit 20, a bus driving system 30 is implemented as shown in FIG. 4, and is connected to the bus line 22. References 31a/31b/31c and 31d designate signal transition accelerating driver circuits similar in circuit configuration to the signal transition accelerating driver circuit 20, and the signal transition accelerating driver circuits 31a/31b/31c/31d are connected to the bus line 22 at intervals. A clock signal CLK1 is supplied to all the signal transition accelerating driver circuits 31a/31b/31c/31d. A data signal Sin-0 and an enable signal EBL3-0 are supplied to the signal transition accelerating driver circuit 31a, and a data signal Sin-1 and an enable signal EBL3-1 are supplied to the signal transition accelerating driver circuit 31d. A data signal of the low level and an enable signal of low level are supplied to each of the signal transition accelerating driver circuits 31b/31c. One of the enable signals EBL3-0 and EBL3-1 is changed to the high level, and the other enable signal EBL3-1 or EBL3-0 remains low. For this reason, the signal transition accelerating driver circuit 31a or 31d changes the bus line 22 to the same potential level as the data signal Sin-0 or Sin-1, and the other signal transition accelerating driver circuits 31b/32c/32d or 31a/31b/31c accelerate the potential change on the bus line 22.

Figure 5:
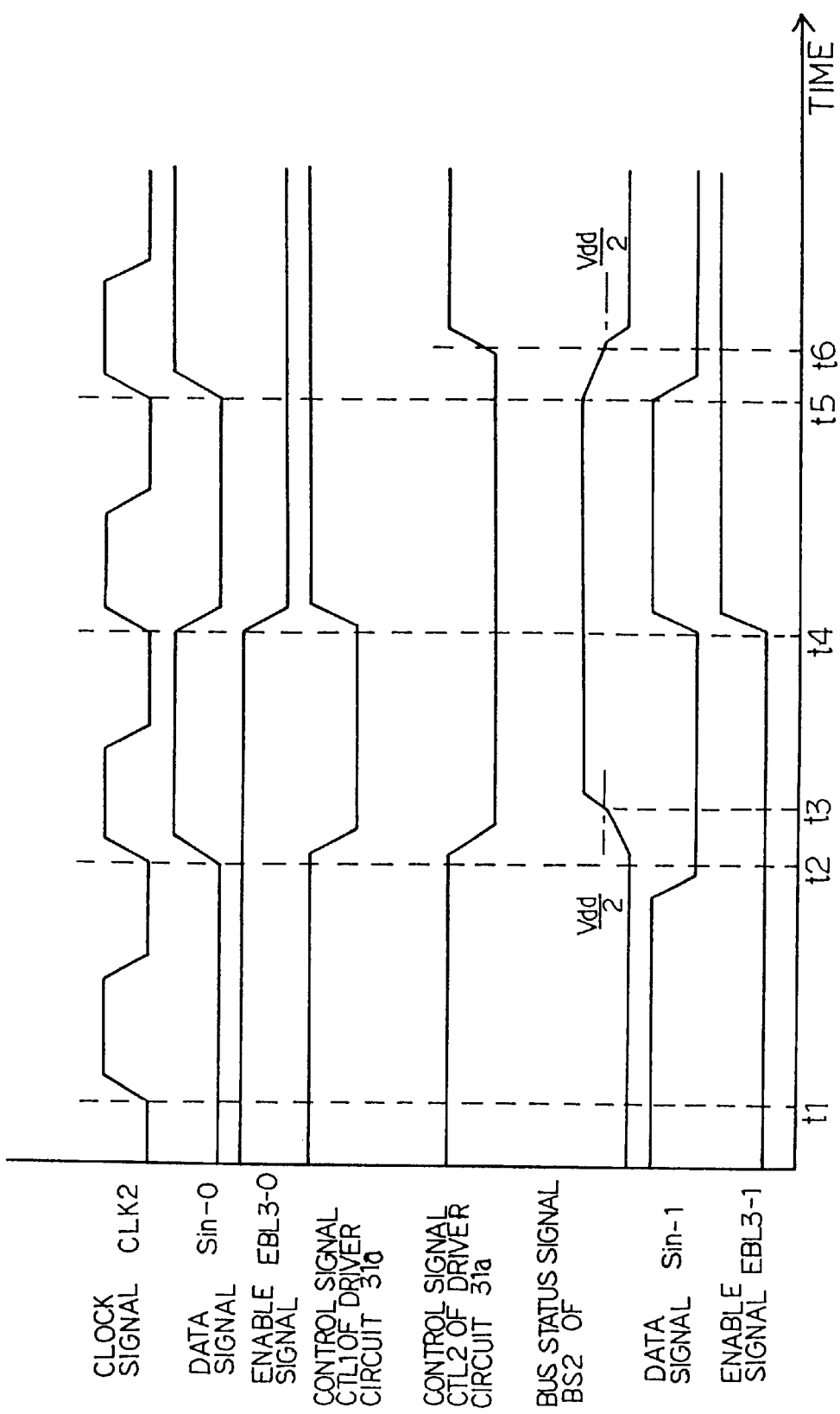
FIG. 5 is a timing chart showing the circuit behavior of the bus driving system.

The bus driving system 30 drives the bus line 22 as shown in FIG. 5. The enable signal EBL3-0 is staying in the high level between time t1 and time t2, and the data signal Sin-0 is in the low level. The control signal CTL1 of the driver circuit 31a is in the high level, and causes the p-channel enhancement type field effect transistor Qp2 of the driver circuit 31a to turn off. The control signal CTL2 of the driver circuit 31a is in the high level, and causes the n-channel enhancement type field effect transistor Qn2 of the driver circuit 31a to turn on. The n-channel enhancement type field effect transistor Qn2 discharges the bus line 22, and the bus line 22 is in the low level.

The data signal Sin-0 is changed from the low level to the high level at time t2, and the enable signal EBL3-0 allows the driver circuit 31a to respond to the data signal Sin-0 of the high level. The driver circuit 31a changes the control signals CTL1 and CTL2 to the low level. The p-channel enhancement type field effect transistor Qp2 turns on, and the n-channel enhancement type field effect transistor Qn2 turns off. Then, the driver circuit 31a supplies electric current to the bus line 22, and the bus line 22 starts to gradually raise the potential level.

The potential level on the bus line 22 exceeds the threshold of the AND gates 26b of the other driving circuits 31b to 31d, and the other driving circuits 31b to 31d change the control signals CTL1 to the low level. Then, the p-channel enhancement type field effect transistors Qp2 of the other driving circuits 31b to 31d turn on at time t3, and a large amount of current flows through the p-channel enhancement type field effect transistors Qp2 of the driver circuits 31b to 31d to the bus line 22. Thus, the other driving circuits 31b to 31d accelerate the potential change on the bus line 22.

The bus status signal BS2 of the high level is latched by the delay latch circuits 27a of the driving circuits 31b to 31d at time t4, and stops the acceleration.

The enable signal EBL3-0 is changed to the low level at time t4, and the enable signal EBL3-1 is concurrently changed to the high level. The enable signal EBL3-1 is staying at the high level, and the driving circuit 31d becomes responsive to the data signal Sin-1. The data signal Sin-1 is changed to the high level at time t4. Although the p-channel enhancement type field effect transistor Qp2 of the driving circuit 31d turns on, the bus line 22 has already reached the high level.

The data signal Sin-1 is changed to the low level at time t5, and the driving circuit 31d changes the p-channel enhancement type field effect transistor Qp2 and the n-channel enhancement type field effect transistor Qn2 to the off-state and the on-state, respectively. The n-channel enhancement type field effect transistor Qn2 of the driver circuit 31d discharges the electric charge from the bus line 22, and the bus line 22 gradually decays the potential level from time t5.

The potential level on the bus line 22 becomes lower than the threshold of the NOR gate 26d of the driving circuits 31a to 31c, and the driving circuits 31a to 31c changes the control signals CTL2 to the high level at time t6. Then, the n-channel enhancement type field effect transistors Qn2 of the driving circuits 31a to 31c turn on, and a large amount of current is discharged through the n-channel enhancement type field effect transistors Qn2. For this reason, the potential level on the bus line 22 rapidly goes down to the low level. Tough not shown in FIG. 5, the driving circuits 31a to 31c stop the acceleration at the next leading edge of the clock signal CLK2.

As will be understood from the foregoing description, the clock signal CLK2 accurately defines the time period for the acceleration, and the manufacturer easily optimizes the accelerating operation of the signal transition accelerating driver circuit 20. Moreover, the timer controlled by the clock signal CLK2 merely occupies narrow area, and the manufacturer does not need a large semiconductor chip. This results in reduction in production cost.

In the first embodiment, the control signals CTL1/CTL2 and the enable signal EBL2 serve as a first control signal and a second control signal, respectively. While the enable signal EBL2 or the second control signal is staying in the high level, the signal transition accelerating driver circuit 20 is responsive to the data signal Sin, and, accordingly, is in a first mode. On the other hand, the signal transition accelerating driver circuit 20 becomes responsive to the potential level on the bus line 22 in the presence of the enable signal EBL2 of the low level, and is in a second mode.

Second Embodiment

Figure 6:
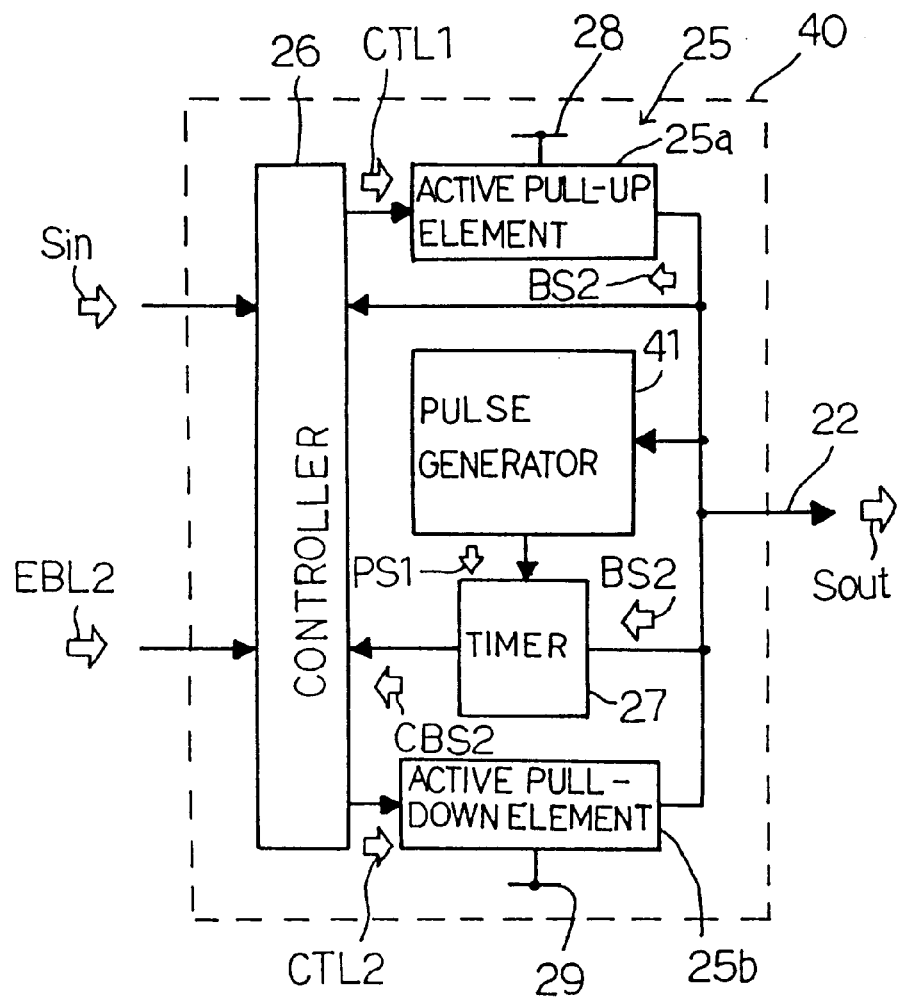
FIG. 6 is a block diagram showing another signal transition accelerating driver circuit according to the present invention.

FIG. 6 illustrates another signal transition accelerating driver circuit 40 embodying the present invention. Although the clock signal CLK1 is supplied from the outside to the signal transition accelerating driver circuit 20, the signal transition accelerating driver circuit 40 has a built-in pulse generator 41. The other circuit components of the signal transition accelerating driver circuit 40 are corresponding to those of the signal transition accelerating driver circuit 20, and are labeled with the same references designating the corresponding circuit components of the driver circuit 20 without detailed description. In the following description, the high level and the low level are assumed to be regulated to Vdd and the ground level.

Figure 7:
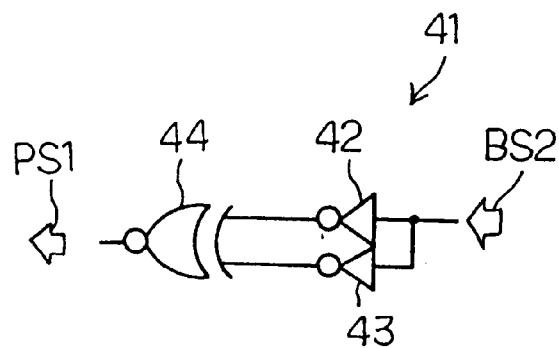
FIG. 7 is a logic diagram showing the circuit configuration of a pulse generator incorporated in the signal transition accelerating driver circuit.

FIG. 7 illustrates the circuit configuration of the pulse generator 41. The pulse generator 41 comprises inverters 42/43 and an exclusive NOR-gate 44. The inverters 42/43 are connected between the bus line 22 and two input nodes of the exclusive-NOR gate 44, and the exclusive-NOR gate 44 supplies a pulse signal PS1 to the timer 27. The inverter 42 has a threshold between the low level and an intermediate level Vdd/2, and the other inverter 43 has a threshold between the intermediate level Vdd/2 and the high level.

Figure 8:
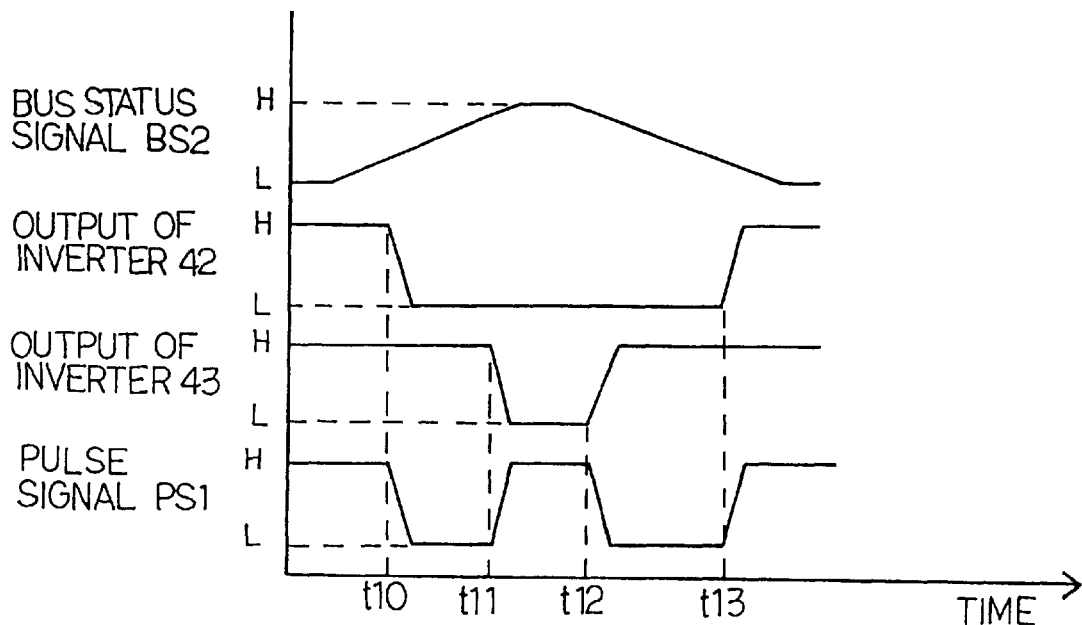
FIG. 8 is a timing chart showing generation of a pulse signal.

FIG. 8 illustrates the circuit behavior of the pulse generator 41. While the potential level on the bus line 22 or the bus status signal BS2 is rising from the low level toward the high level, the bus status signal BS2 firstly exceeds the threshold of the inverter 42 at time t10 and, thereafter, the threshold of the other inverter 43 at time t11. When the bus status signal BS2 exceeds the threshold of the inverter 42, the inverter 42 changes the output signal to the low level, and the exclusive-NOR gate 44 changes the pulse signal PS1 from the high level to the low level. The exclusive-NOR gate keeps the pulse signal PS1 in the low level until the bus status signal BS2 exceeds the threshold of the other inverter 43. When the bus status signal BS2 exceeds the threshold of the inverter 43, the inverter 43 changes the output signal to the low level, and the exclusive-NOR gate 44 changes the pulse signal PS1 to the high level at time t11. Thus, the exclusive-NOR gate 44 keeps the pulse signal PS1 in the low level between time t10 and time t11.

While the potential level on the bus line 22 is going down from the high level toward the low level, the exclusive-OR gate similarly behaves. The bus status signal BS2 passes the threshold of the inverter 43 at time t12, and the inverter 43 changes the output signal to the high level, and the exclusive-NOR gate 44 changes the pulse signal PS1 to the low level. Subsequently, the bus status signal BS2 passes the threshold of the other inverter 42 t time t13, and the inverter 42 changes the output signal to the high level. The exclusive-NOR gate 44 changes the pulse signal PS1 to the high level. Thus, the exclusive-NOR gate 44 keeps the pulse signal PS1 in the low level between time t12 and time t13.

Figure 9:
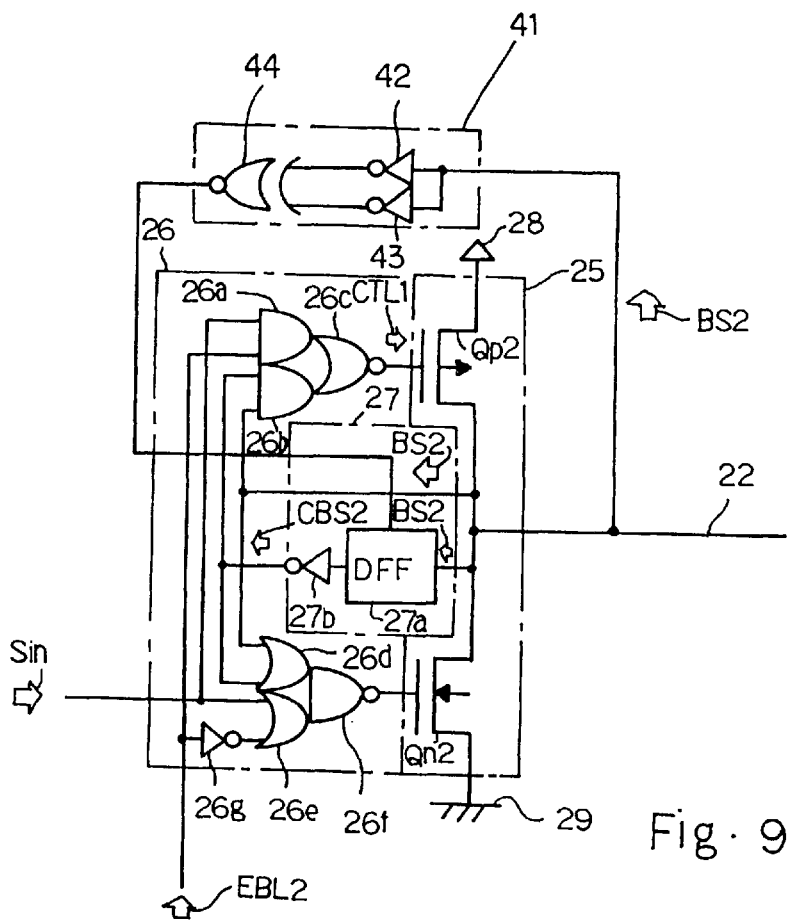
FIG. 9 is a logic diagram showing the circuit configuration of the signal transition accelerating driver circuit.
Figure 10:
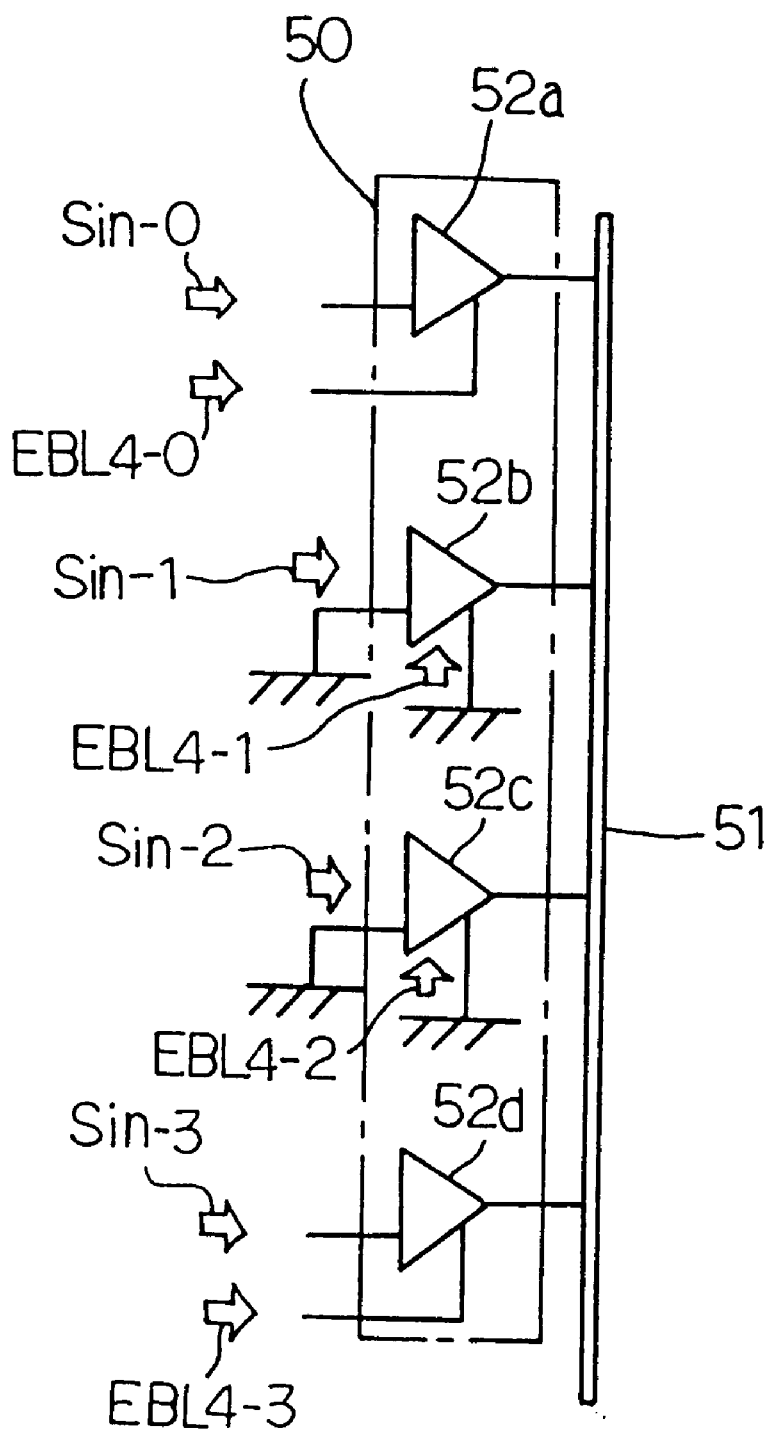
FIG. 10 is a circuit diagram showing another bus driving system according to the present invention.

FIG. 9 illustrates the signal transition accelerating driver circuit 40 in the logic gate level. Circuit components of the signal transition accelerating driver circuit 40 are simply labeled with the same references designating corresponding circuit components of the signal transition accelerating driver circuit 20. The output driver 25 and the controller 26 behaves as similar to those of the signal transition accelerating driver circuit 20, and no further description is incorporated hereinbelow.

The timer 27 cooperates with the pulse generator 41, and defines a time period for accelerating a signal transition on the bus line 22. The potential level on the bus line 22 or the bus status signal BS2 is assumed to be in the low level. The inverted signal CBS2 is in the high level, and the controller 26 is responsive to the bus status signal BS2. The bus status signal BS2 starts to rise toward the high level, and the signal transition accelerating driver 40 accelerates the potential variation on the bus line 22. When the bus status signal BS2 exceeds the threshold of the inverter 43, the exclusive-NOR gate 44 changes the pulse signal PS1 from the low level to the high level, and the delay flip flop 27a latches the bus status signal BS2 of the high level. The inverter 27b changes the inverted signal CBS2 to the low level, and the controller 26 stops the acceleration. In other words, the signal transition accelerating driver circuit 40 continues the accelerating operation immediately before the high level.

While the bus status signal BS2 is going down to the low level, the signal transition accelerating driver circuit 40 accelerates the variation of the potential on the bus line 22 immediately before the low level.

Using the signal transition accelerating driver circuit 40, a bus driving system 50 is expected to drive a bus line 51 at high speed. The bus driving system 50 includes four signal transition accelerating driver circuits 52a/52b/52c/52d connected in parallel to the bus line 51. The signal transition accelerating driver circuits 52a to 52d have the circuit configuration shown in FIG. 9. A data signal Sin-0 and an enable signal EBL4-0 are supplied to the signal transition accelerating driver circuit 52a, and another data signal Sin-3 and an enable signal EBL4-3 are supplied to the signal transition accelerating driver circuit 52d. The enable signals EBL4-0/EBL4-1 are selectively changed to the active level. However, both enable signals EBL4-0/EBL4-1 are never concurrently in the high level. Data signals Sin-1/Sin-2 and enable signals EBL4-1/EBL4-2 are fixed to the low level.

Figure 11:
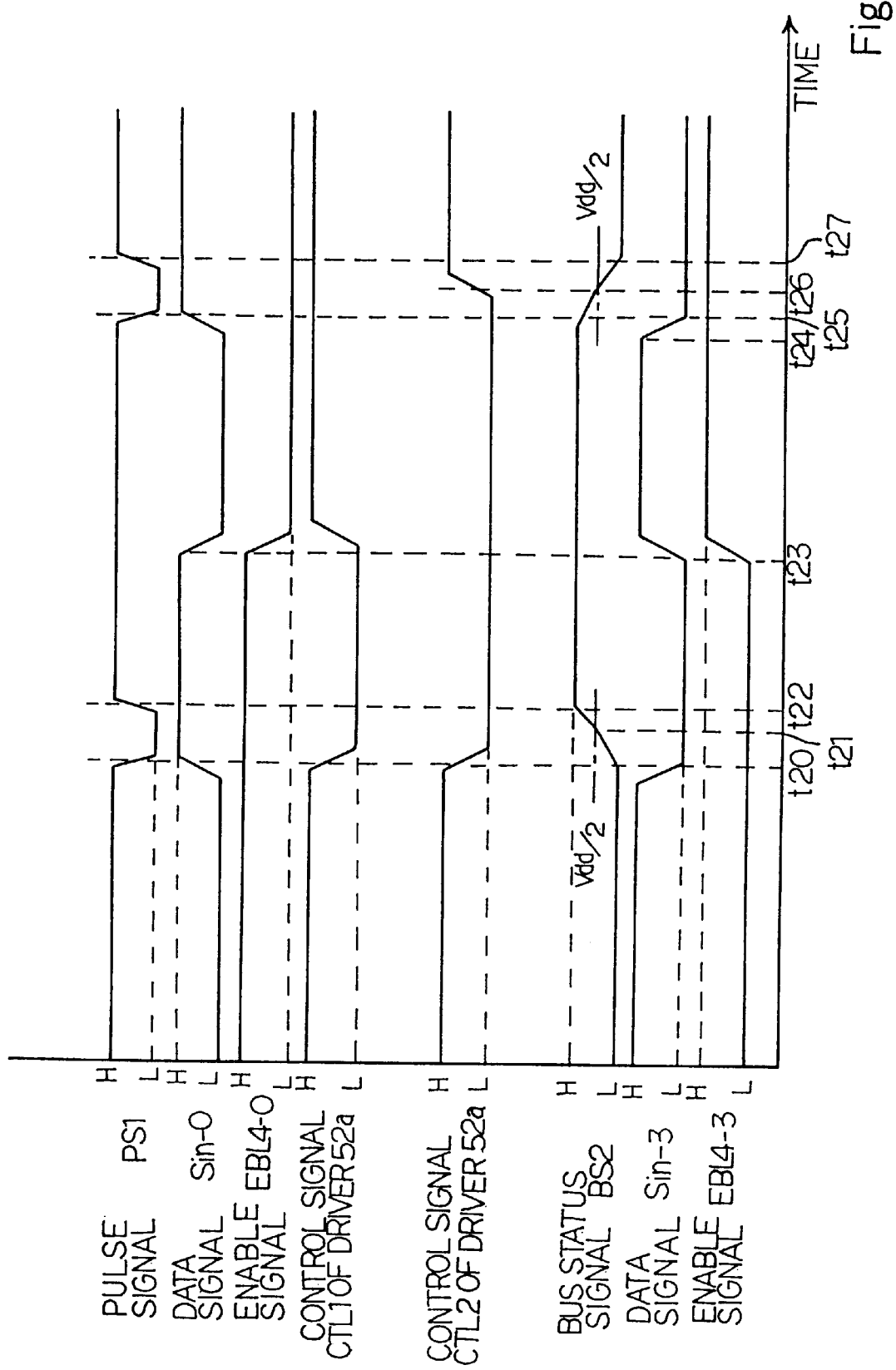
FIG. 11 is a timing chart showing the circuit behavior of the bus driving system.

The bus driver system 50 drives the bus line 51 as shown in FIG. 11. The enable signal EBL4-0 is staying, in the high level before time t20, and the enable signal EBL4-1 is in the low level. In this situation, the signal transition accelerating driver circuit 52a is responsive to the data signal Sin-0, and the other signal transition accelerating driver circuits 52b to 52d are ready for acceleration.

The data signal Sin-0 is changed from the low level to the high level at time t20, and the signal transition accelerating driver circuit 52a changes the control signals CTL1/CTL2 to the low level. The p-channel enhancement type field effect transistor Qp2 turns on, and the n-channel enhancement type field effect transistor Qn2 turns off. Electric current flows through the p-channel enhancement type field effect transistor Qp2 to the bus line 51, and raises the potential level on the bus line 51 or the bus status signal BS2. The potential rise on the bus line 51 causes the pulse generator 41 to change the pulse signal PS1 to the low level.

The bus status signal BS2 causes the other signal transition accelerating driver circuits 52b to 52d to change the p-channel enhancement type field effect transistors Qp2 to the on-state to turn on, and a large amount of current flows through the p-channel enhancement type field effect transistors Qp2 to the bus line 51. For this reason, the bus status signal BS2 rapidly rises the potential level from time t21, and the pulse generator 41 changes the pulse signal PS1 to the high level at time t22. With the pulse rise, the pulse generator 41 notifies the end point of the acceleration to the signal transition accelerating driver circuits 52b to 52d, and the signal transition accelerating driver circuits 52b to 52d stops the acceleration immediately before reaching the high level.

The enable signal EBL4-0 is changed to the low level at time t23, and the enable signal EBL4-3 is concurrently changed to the high level. Then, the signal transition accelerating driver circuit 52d becomes responsive to the data signal Sin-3, and the other signal transition accelerating driver circuits 52a to 52c enter into the ready-for-acceleration state.

The data signal Sin-3 is changed to the low level at time t24, and the signal transition accelerating driver circuit 52d changes the control signal CTL1 and the control signal CTL2 to the high level. The bus line 51 is discharged through the n-channel enhancement type field effect transistor Qn2 of the driver circuit 52d, and the potential level on the bus line 51 gradually goes down. The pulse generator 41 changes the pulse signal PS1 to the low level, and the other signal transition accelerating driver circuits 52a to 52c starts to accelerate the potential variation on the bus line 51. For this reason, the bus status signal BS2 rapidly goes down to the low level from time t26.

The pulse generator 41 changes the pulse signal PS1 to the high level at time t27, and the signal transition accelerating driver circuits 52a to 52c stop the accelerating operation immediately before reaching the low level.

As will be appreciated from the foregoing description, the pulse generator 41 generates the pulse signal PS1 from the bus status signal BS2, and gives the end point of the accelerating period to the controller. Thus, the pulse signal PS1 allows the timer 27 to accurately define the time period for the accelerating operation, and the timer 27 does not occupy wide area.

Although particular embodiments of the present invention have been shown and described, it will be apparent to those skilled in the art that various chances and modifications may be made without departing from the spirit and scope of the present invention.

For example, the field effect transistors may be replaced with bipolar transistors. Any kind of bi-stable circuit is available for the definition of the end point.

The signal transition accelerating driver circuit is never limited to a bus line. It available for any kind of signal line.

A signal transition accelerating driver circuit incorporated in a bus driving system may have a controller only responsive to the potential level on an associated bus line, and other signal transition accelerating drivers have the controllers selectively responsive to a data signal and the potential level on the bus line.

What is claimed is:

1. A signal driving circuit comprising:

an output driver driving a signal line in response to first and second control signals (CTL 1 and CTL 2) for selectively connecting respective first and second sources of potential to the signal line;

a controller having first and second operation modes, the controller in the first mode selectively producing the first and second control signals in response to a data signal, the controller in the second mode selectively producing the first and second control signals in response to a signal line potential and not in response to the data signal, to accelerate change of the signal line potential; and a timer, implemented as one of a delay flip-flop and a shift register, responsive to a pulse signal limiting a duration of production of the first and second control signals by the controller in the second mode, wherein the timer latches the signal line potential in response to the pulse signal to produce an inverted signal line potential, and wherein a logical combination of the signal line potential and the inverted signal line potential controls the controller to selectively produce the first and second control signals in the second mode.

2. The signal driving circuit as set forth in claim 1, wherein, when the inverted signal line potential is equal in potential level to the signal line potential, the controller in the second mode selectively produces one of the first and second control signals to connect the signal line to one of the first and second sources of potential, and wherein, when the inverted signal line potential is opposite to the signal line potential, the controller in the second mode produces neither the first control signal nor the second control signal.

3. The signal driving circuit as set forth in claim 2, the controller comprising:

a first logic gate supplied with the signal line potential and the inverted signal line potential;

a second logic gate supplied with the data signal and an enable signal;

a third logic gate supplied with outputs of the first and second logic gates for producing the first control signal;

a fourth logic gate supplied with the signal line potential and the inverted signal line potential;

a fifth logic gate supplied with the data signal and the enable signal; and a sixth logic gate supplied with outputs of the fourth and fifth logic gates for producing the second control signal.

4. The signal driving circuit as set forth in claim 3, wherein the first and second logic gates are AND gates, the third logic gate is a NOR gate, the fourth logic gate is an OR gate, the fifth logic gate is a combination of an OR gate and an inverter and the sixth logic gate is a NAND gate.

5. The signal driving circuit as set forth in claim 3, wherein the first control signal and the second control signal are supplied to respective control nodes of an active pull-up element and an active pull-down element.

6. The signal driving circuit as set forth in claim 5, wherein the active pull-up element is a first field effect transistor of a first conductivity type connected between one of the first and second sources of potential and the signal line, and wherein the active pull-down element is a second field effect transistor of a second conductivity type connected between the other of the first and second sources of potential and the signal line.

7. The signal driving circuit as set forth in claim 6, wherein the first field effect transistor is a p-channel enhancement transistor, and the second field effect transistor is an n-channel enhancement transistor.

8. The signal driving circuit as set forth in claim 2, wherein the signal line potential is supplied to a control node of a bi-stable circuit, and an inverter is connected to an output node of the bi-stable circuit for producing the inverted signal line potential.

9. A signal driving circuit comprising:

an output driver driving a signal line in response to first and second control signals (CTL 1 and CTL 2) for selectively connecting respective first and second sources of potential to the signal line;

a controller having first and second operation modes, the controller in the first mode selectively producing the first and second control signals in response to a data signal, the controller in the second mode selectively producing the first and second control signals in response to a signal line potential and not in response to the data signal, to accelerate change of the signal line potential;

a timer, implemented as one of a delay flip-flop and a shift register, responsive to a pulse signal limiting a duration of production of the first and second control signals by the controller in the second mode; and a pulse generator connected between the signal line and the timer for producing the pulse signal in response to variation of the signal line potential.

10. The signal driving circuit as set forth in claim 9, wherein the signal line potential is varied between a high level corresponding to the potential level of an active potential source and a low level corresponding to the potential level of an inactive potential source, and wherein the pulse generator changes the pulse signal level at a first intermediate level, and at a second intermediate level.

11. The signal driving circuit as set forth in claim 10, wherein the pulse signal is supplied to a bi-stable circuit for latching the signal line potential at the first intermediate level and the second intermediate level, wherein an inverter is connected to an output node of the bi-stable circuit to produce an inverted signal line potential, and wherein the controller selectively produces the first control signal and the second control signal in response to a logical combination of the inverted signal line potential and the signal line potential.

12. The signal driving circuit as set forth in claim 10, wherein the first intermediate level is closer to the high level than the second intermediate level.

13. The signal driving circuit as set forth in claim 12, wherein a bi-stable circuit latches the signal line potential at the first intermediate level while the signal line potential is being varied from the low level to the high level, and wherein the bi-stable circuit latches the signal line potential at the second intermediate level while the signal line potential is being varied from the high level to the low level.

14. A driver system for changing a potential level on a signal line, comprising:

a first driver circuit including a first output driver driving a signal line in response to first and second control signals (CTL 1 and CTL 2) for selectively connecting respective sources of potential to the signal line, a first controller having first and second operation modes, the first controller in the first mode selectively producing the first and second control signals (CTL 1 and CTL 2) in response to a first data signal, the first controller in the second mode selectively producing said first and second signals in response to a first signal line potential to accelerate change of the first signal line potential, and a first timer responsive to a first pulse signal limiting a duration of production of said first and second control signals (CTL 1 and CTL 2) by the first controller in the second mode;

a second driver circuit including a second output driver driving the signal line in response to third and fourth control signals for selectively connecting the respective sources of potential to the signal line, a second controller having first and second operation modes, the second controller in the first mode selectively producing the third and fourth control signals in response to a second data signal, the second controller in the second mode selectively producing third and fourth signals in response to a second signal line potential to accelerate change of the second signal line potential, and a second timer responsive to a second pulse signal limiting a duration of production of said third and fourth control signals by the second controller in the second mode; and a third driver circuit including a third output driver driving the signal line in response to fifth and sixth control signals for selectively connecting respective sources of potential to the signal line, a third controller operating exclusively in the second operation mode to selectively produce fifth and sixth signals in response to a third signal line potential to accelerate change of the third signal line potential, and a third timer responsive to a third pulse signal limiting a duration of production of said fifth and sixth control signals by the third controller in the second mode.

* * * * *